(12) United States Patent
Kobayashi et al.

(10) Patent No.: US 8,013,370 B2
(45) Date of Patent: Sep. 6, 2011

(54) SOLID-STATE IMAGING DEVICE

(75) Inventors: Hiroshi Kobayashi, Kawasaki (JP); Katsuyoshi Yamamoto, Kawasaki (JP); Tadao Inoue, Kawasaki (JP); Toshitaka Mizuguchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 478 days.

(21) Appl. No.: 11/249,332

(22) Filed: Oct. 14, 2005

(65) Prior Publication Data

US 2006/0214195 A1 Sep. 28, 2006

(30) Foreign Application Priority Data

Mar. 25, 2005 (JP) ................. 2005-089268

(51) Int. Cl.
*H01L 31/062* (2006.01)
(52) U.S. Cl. ........................ 257/291; 257/458
(58) Field of Classification Search .................. None
See application file for complete search history.

(56) References Cited

U.S. PATENT DOCUMENTS

| 6,465,859 B1 | 10/2002 | Fujiwara et al. |
| 6,987,537 B2 | 1/2006 | Inoue |
| 2004/0026695 A1 | 2/2004 | Francois |
| 2004/0056176 A1* | 3/2004 | Shizukuishi ............... 250/208.1 |
| 2006/0183265 A1 | 8/2006 | Oh et al. |

FOREIGN PATENT DOCUMENTS

| EP | 1 367 650 A1 | 12/2003 |
| JP | 2000-150846 | 5/2000 |
| JP | 2002-134726 | 5/2002 |
| JP | 2003-249632 | 9/2003 |
| JP | 2004-071931 | 3/2004 |
| JP | 2004-221527 | 8/2004 |
| JP | 2006-229206 | 8/2006 |
| KR | 2006-91343 A | 8/2006 |

OTHER PUBLICATIONS

"Japanese Office Action", mailed by JPO and corresponding to Japanese application No. 2005-089268 on Jan. 26, 2010, with English translation.
"Extended European Search Report", mailed by EPO and corresponding to European application No. 05256577.7 on May 12, 2011.

* cited by examiner

*Primary Examiner* — Michael B Shingleton
(74) *Attorney, Agent, or Firm* — Fujitsu Patent Center

(57) ABSTRACT

A solid-state imaging device has a substrate in which are formed a pixel array portion having a plurality of pixels, and a peripheral circuitry portion. The device is characterized in that a first multilevel metallization structure is formed over the peripheral circuitry portion, and a second multilevel metallization structure thinner than the first multilevel metallization structure is formed over the pixel array portion.

19 Claims, 12 Drawing Sheets

PRIOR-ART EXAMPLE

PRINCIPLES OF THE INVENTION

FIRST EMBODIMENT

SECOND EMBODIMENT

THIRD EMBODIMENT

SOLID-STATE IMAGING DEVICE

CROSS-REFERENCE TO RELATED APPLICATIONS

This application is based upon and claims the benefit of priority from the prior Japanese Patent Application No. 2005-89268, filed on Mar. 25, 2005, the entire contents of which are incorporated herein by reference.

BACKGROUND OF THE INVENTION

1. Field of the Invention

The present invention relates to a solid-state imaging device, and more particularly to a solid-state imaging device based on CMOS technology.

2. Description of the Related Art

The CMOS-based solid-state imaging device, generally an active pixel sensor or a CMOS image sensor, has within each pixel of a pixel array a photoelectric convertor and transistors which reset and amplify the convertor, and has, in peripheral circuitry, drive circuits which drive the individual pixels and also output circuits and image processing circuits which amplify electrical signals output from the individual pixels and carry out image processing. It is anticipated that such CMOS image sensors will provide solid-state imaging devices that are less costly on account of the CMOS processes used in fabrication and that are capable of achieving a higher image quality due to improvements in pixel structure.

Because CMOS image sensors are used in camera modules installed on mobile devices such as cellular phones and information terminals, there is a strong desire in the industry for larger scale integration and a smaller chip size. In order to satisfy this aspect a multilevel metallization structure within the chip is required. However, the use of a multilevel metallization structure means the formation over the pixels of a multilevel metallization structure composed of multiple metallization levels and dielectric layers between the levels, making it difficult to efficiently guide incident light to the photoelectric convertors within the pixels. Decreased sensitivity and blurring arise as a consequence of the scattering of incident light by the multilevel metallization and attenuation of the incident light by the multiple layers of dielectric film.

FIG. 1 is a schematic cross-sectional diagram of a prior-art CMOS image sensor. A chip 1 consisting of a semiconductor substrate has at the center thereof a pixel array 10 composed of a plurality of pixels, and peripheral circuitry 12 is formed at the perimeter of the pixel array 10. Lower and upper layers of multilevel metallization 22 and 20 are formed on the substrate over both the pixel array 10 and the peripheral circuitry 12.

The CMOS image sensors currently in common use typically employ a multilevel metallization structure having, for example, three levels. In addition to the peripheral circuitry, this multilevel metallization is used also for the connection of transistors within the pixels. However, as noted above, because it is necessary to avoid scattering incident light, Japanese Patent Application Laid-open No. 2004-221527 and Japanese Patent Application Laid-open No. 2003-249632 describe the use of a structure in which metallization is not formed over the photoelectric convertor within the pixels and which is able guide incident light to the convertor. According to this prior art, a trench-like hole is formed in the multilevel metallization structure over each pixel, and a dielectric material is buried in the hole to give a photoconductive structure.

In addition, the CMOS image sensor has over each pixel a microlens for collecting incident light and a color filter. Such a construction requires a complex fabrication process. As a solution to this problem, Japanese Patent Application Laid-open No. 2002-134726, for example, teaches a process in which part of the dielectric film over the pixel is removed to form a trench, and a color filter pattern having a convex shape is formed thereon to serve as both the microlens and the color filter.

SUMMARY OF THE INVENTION

The prior art disclosed in the above patent publications thus provide structures for guiding light to individual pixels or involve the formation of trench structures. However, such structures are quite difficult to fabricate.

Moreover, if image sensor chip for camera modules is disigned as a large-scale integrated circuit, it is impossible to avoid having the incident light pass through the thicker multilevel metallization structure (e.g., a five-layer structure) of the peripheral circuitry. Accordingly, there has existed a desire for a multilevel metallization structure which is simple and which minimizing the scattering and attenuation of incident light to the pixels.

It is therefore an object of the invention to provide a solid-state imaging device having the multilevel metallization structure needed for larger-scale integration and a smaller chip size, and also having a structure capable of effectively suppressing the scattering and attenuation of incident light to the pixels.

According to a first aspect, in order to achieve the above objective the invention provides a solid-state imaging device composed of a substrate in which are formed a pixel array portion having a plurality of pixels, and a peripheral circuitry portion peripheral to the pixel array. The device is characterized in that a first multilevel metallization structure is formed over the peripheral circuitry portion, and a second multilevel metallization structure thinner than the first multilevel metallization structure is formed over the pixel array portion.

According to this first aspect of the invention, over the peripheral circuitry portion, the first multilevel metallization structure enables highly integrated circuits to be provided in a small surface area. At the same time, over the pixel array portion having a plurality of pixels, the formation of a second multilevel metallization structure which is thinner than the first multilevel metallization structure enables the scattering and attenuation of incident light to the pixels to be suppressed. Moreover, by giving the multilevel metallization structure over the pixel array portion a uniformly thin structure, the fabrication process can be simplified.

In a preferred embodiment of the above first aspect of the invention, the first multilevel metallization structure over the peripheral circuitry portion and the second multilevel metallization structure over the pixel array portion form a single trench structure over the pixel array, the trench structure has a protrusion in at least one corner thereof. The solid-state imaging device according to this embodiment also has a color filter film formed on a bottom of the trench structure by spin coating and has a microlens over each pixel. The resin material applied during spin coating to form the color filter film or microlenses is pushed against the protrusion, enabling the formation of a uniform film on the bottom of the trench structure.

In another preferred embodiment of the above first aspect of the invention, the first multilevel metallization structure over the peripheral circuitry portion and the second multilevel metallization structure over the pixel array portion form a single trench structure over the pixel array, the trench structure extends over a region that includes at least part of the pixel array portion. The trench structure region may coincide with a central light-receiving pixel region of the pixel array portion that excludes peripheral black pixels. Alternatively, the trench structure region may be a region that is wider than the central light-receiving pixel region of the pixel array portion and is of a degree where incident light entering at an angle through a collecting lens in the package reaches the light-receiving pixel region.

In yet another preferred embodiment of the above first aspect of the invention, the first multilevel metallization structure over the peripheral circuitry portion and the second multilevel metallization structure over the pixel array portion form a single trench structure over the pixel array, an optical color filter film is formed within the trench structure, a microlens for each pixel is formed over the optical color filter film, and the optical color filter film has a thickness which is substantially equal to the depth of the trench structure. Alternatively, the optical color filter film has a thickness which is smaller than the depth of the trench structure.

According to a second aspect, the invention provides a solid-state imaging device composed of a substrate in which are formed a pixel array portion having a plurality of pixels and a peripheral circuitry portion peripheral thereto, a first multilevel metallization structure which is formed over the peripheral circuitry portion and has a plurality of connection layers, and a second multilevel metallization structure which is formed over the pixel array portion and has a smaller number of connection layers than the first multilevel metallization structure.

According to a third aspect, the invention provides a solid-state imaging device composed of a substrate in which are formed a pixel array portion having a plurality of pixels, and a peripheral circuitry portion peripheral to the pixel array; a first multilevel metallization structure which is formed over the peripheral circuitry portion and has a plurality of connection layers; and a second multilevel metallization structure which is formed over the pixel array portion, has a smaller number of connection layers than the first multilevel metallization structure, and has a color filter film formed at a level corresponding to the uppermost level of the first multilevel metallization structure.

In the solid-state imaging device of the invention, a thicker multilevel metallization structure is provided over the peripheral circuitry portion, enabling more highly integrated circuits and a smaller chip size to be achieved. At the same time, a thinner multilevel metallization structure is provided over the pixel array, enabling the attenuation and scattering of incident light to be suppressed.

DESCRIPTION OF THE PREFERRED EMBODIMENTS

Embodiments of the invention are described below in conjunction with the attached diagrams. It is to be understood, however, that these embodiments are not intended to be limiting as the technical scope of the invention will be limited only by the appended claims and equivalents thereof.

Figure 2:
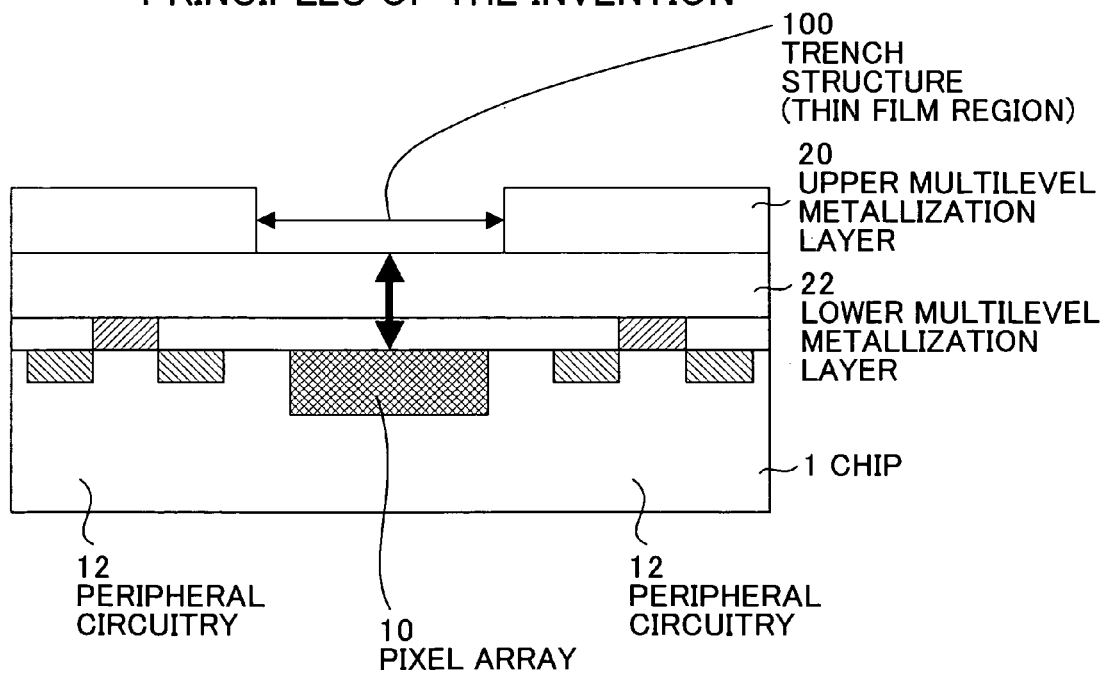
FIG. 2 illustrates the principles of the present invention.

FIG. 2 is a diagram illustrating the principles of the invention. A solid-state imaging device includes, within a chip 1 made of a semiconductor substrate, a pixel array portion 10 having a plurality of pixels, and a peripheral circuitry portion 12 such as analog circuits and digital circuits that is peripheral to the pixel array portion 10. The peripheral circuitry portion 12 has formed thereon a multilevel metallization structure composed of lower and upper multilevel metallization layers 22 and 20. This multilevel metallization structure includes a power distribution metal layer and metallization that connects circuit elements such as transistors. Over the pixel array portion 10, there is formed only the lower multilevel metallization layer 22; the upper multilevel metallization layer 20 is not formed here. Hence, a single trench structure 100 is formed over the pixel array portion 10, thus making the multilevel metallization layer over the pixel array portion 10 a thin film region.

Figure 1:
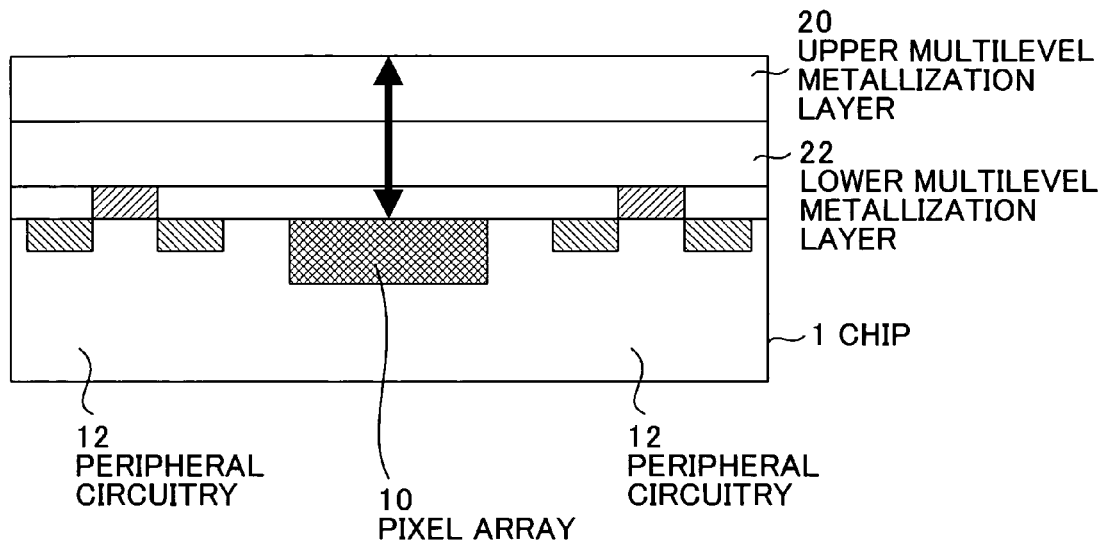
FIG. 1 is a schematic sectional view of a prior-art CMOS image sensor.

In this arrangement, the distance (see arrow in diagram) from the substrate surface over the pixel array portion 10 to the surface of the multilevel metallization layer portion 22 is shorter than the distance to the surface of the multilevel metallization layers in the prior-art example shown in FIG. 1. Therefore, the number of metallization levels present over the substrate surface at the pixel array portion 10 where the photoelectric convertors are formed decreases, the combined thickness of the metal layers and the dielectric layers is smaller, and scattering and attenuation of the incident light can be surpressed. Moreover, because a large number of metallization layers are formed over the peripheral circuitry portion 12, a highly integrated circuit can be achieved on a small surface area.

Figure 3:
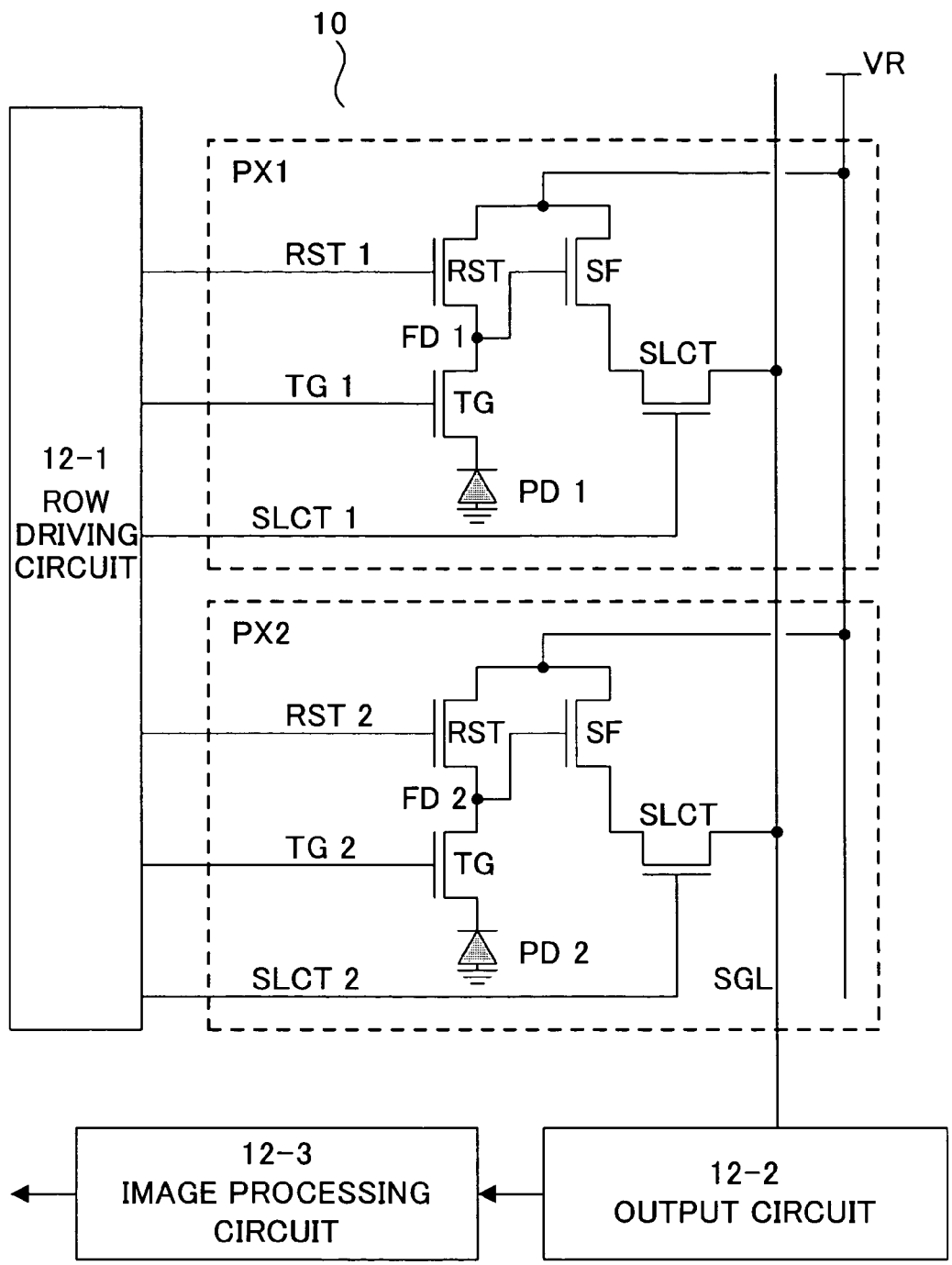
FIG. 3 is a circuit diagram of a CMOS image sensor, which is one example of a solid-state imaging device.

FIG. 3 is a circuit diagram of a CMOS image sensor, which is one example of a solid-state imaging device. A plurality of pixels PX1 and PX2 are arranged as a matrix in the pixel array portion 10. The pixels are of the four transistor type. The pixels each have a photodiode PD1 or PD2 as the photoelectric convertor, a transfer gate transistor TG which transmits the photodiode charge to a node FD1 or FD2, a reset transistor RST which resets the node FD1 or FD2 to a reset voltage VR, a source follower transistor SF which outputs the node FD1 or FD2 voltage, and a selection transistor SLCT which is controlled by a selection line SLCT1 or SLCT2 and connects a source terminal on the source follower transistor SF to an output signal line SGL. A row driving circuit 12-1 drives the reset line RST1 or RST2 which controls the reset transistor, the transfer gate line TG1 or TG2 which controls the transfer gate transistor TG, and the selection line SLCT1 or SLCT2. The output circuit 12-2 amplifies the voltage of each pixel that is output to the output signal line SGL and outputs the image signals for each pixel line by line. An image processing circuit 12-3 performs analog-to-digital conversion of the image signals, and carries out the required image processing on these digital signals.

The row driving circuit 12-1, the output circuit 12-2 and the image processing circuit 12-3 correspond to the peripheral circuitry portion 12 mentioned above. It should also be noted that the pixel array portion 10, represented in FIG. 3 by only two pixels, is in fact arranged in the form of a matrix having a plurality of rows and a plurality of columns.

Figure 4A:
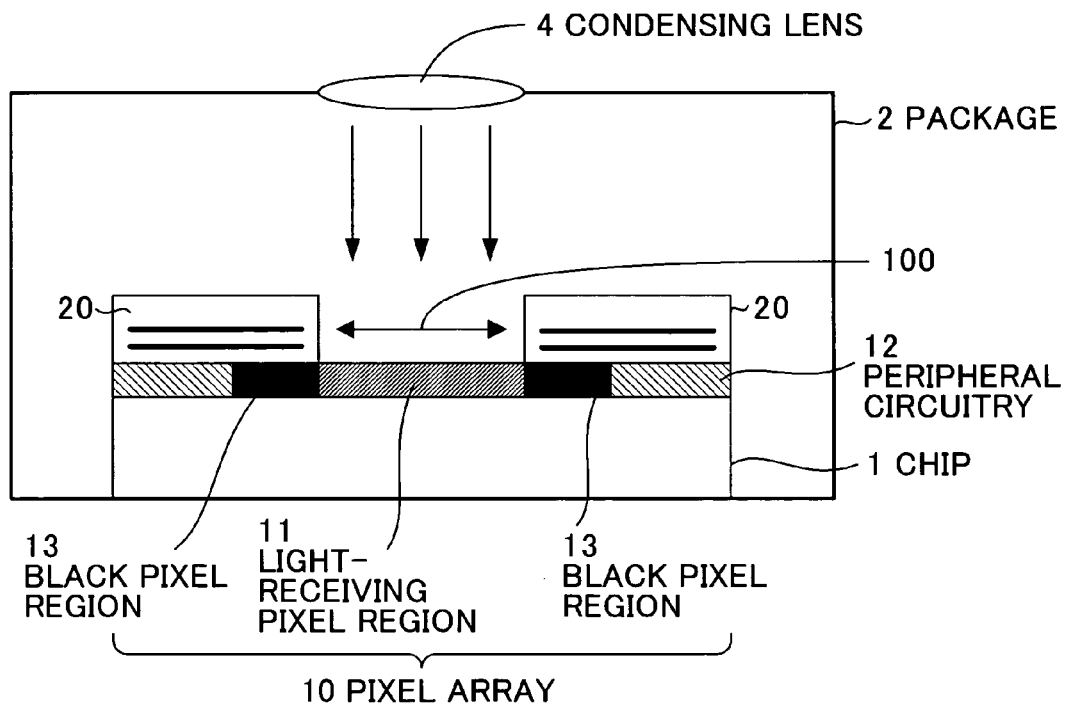
FIG. 4 is a diagram of an image sensor according to a first embodiment of the invention.
Figure 4B:
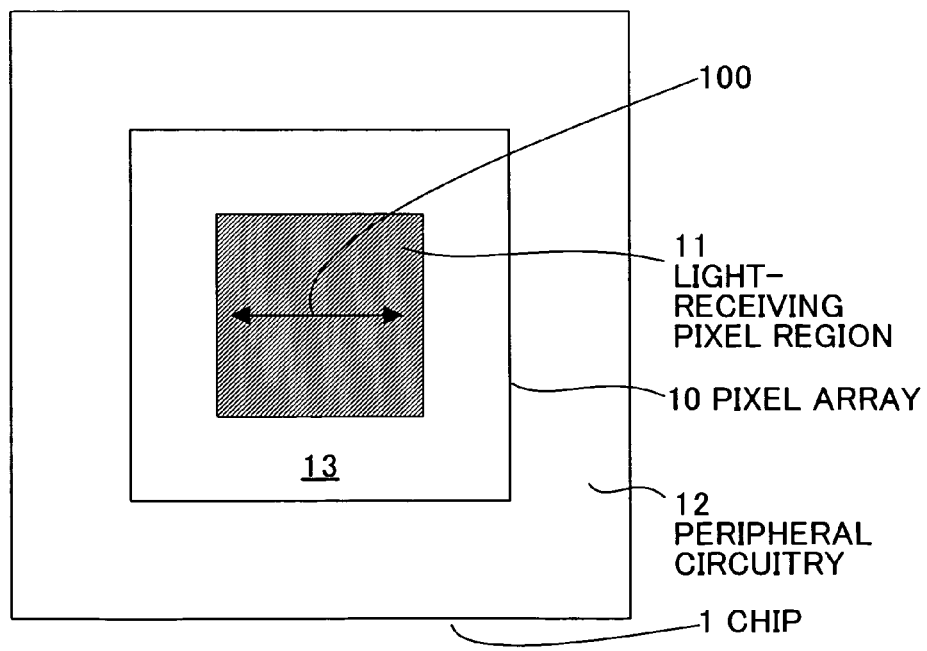

FIG. 4 is a diagram of an image sensor according to a first embodiment of the invention. FIG. 4A is a cross-sectional view of an image sensor chip 1 housed in a package 2, and FIG. 4B is a plan view of the chip 1. The chip 1, which is an image sensor, is contained within the package 2, and a condensing lens 4 is provided at the top of the package 2. The chip 1 has a pixel array portion 10 at the center, and peripheral circuitry portion 12. Here, for the sake of convenience, pixel array portion 10 and periphery circuitry portion 12 each include both circuit elements within the chip and a lower multilevel metallization structure (represented by the reference symbol 22 in FIG. 2). In addition, an upper multilevel metallization structure 20 is provided above the peripheral circuitry portion 12.

The pixel array portion 10 has a black pixel region 13 at the periphery and a light-receiving pixel region 11 at the center. The black pixel region 13 is composed of a barrier film or the like so as not to be receptive to incident light. Image signals detected in this black pixel region 13 are utilized as a reference level for black. Light enters the light-receiving pixel region 11 after having passed through the lower multilevel metallization structure, and this pixel region 11 outputs image signals which correspond to the intensity of the incident light.

In the first embodiment of the invention, an upper multilevel metallization layer 20 is not provided over the light-receiving pixel region 11 of the pixel array portion 10, as a result of which a single trench structure 100 is formed. There is no need to receive light over the black pixel region 13, and so an upper multilevel metallization layer 20 is formed over the region 13. Moreover, because the incident light is substantially perpendicular, the size of the single trench structure 100 is made to substantially coincide with the size of the light-receiving pixel region 11 of the pixel array portion 10. The upper multilevel metallization layer 20 is provided over both the peripheral circuitry portion 12 and the black pixel region 13, enabling the total surface area of the power supply plane formed in the upper multilevel metallization layer 20 to be increased.

Figure 5A:
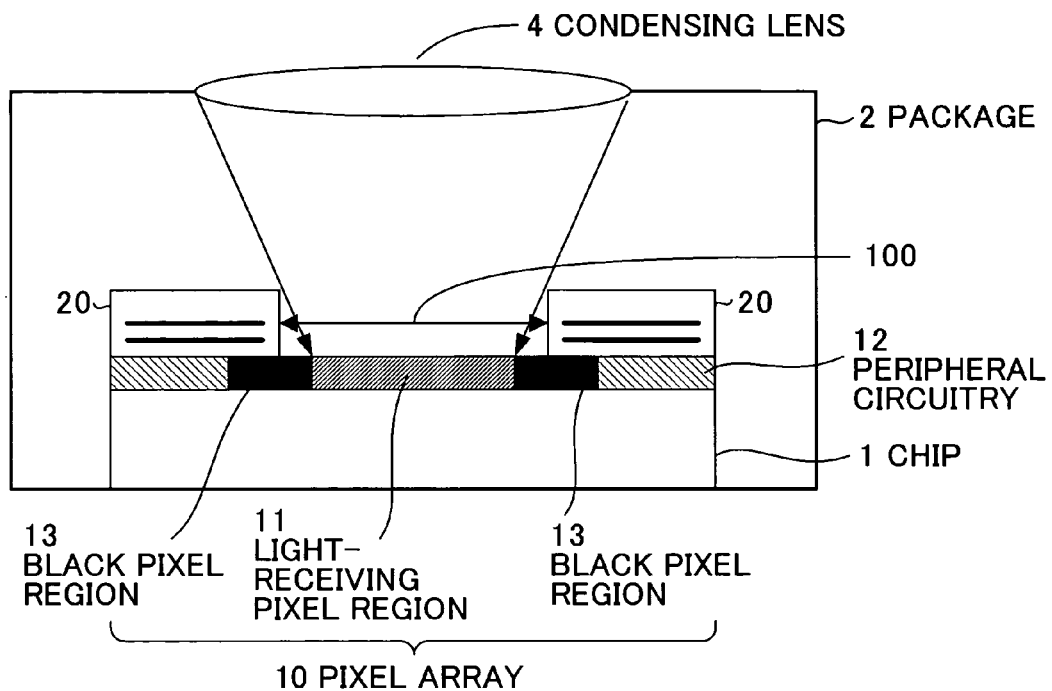
FIG. 5 is a diagram of an image sensor according to a second embodiment of the invention.
Figure 5B:
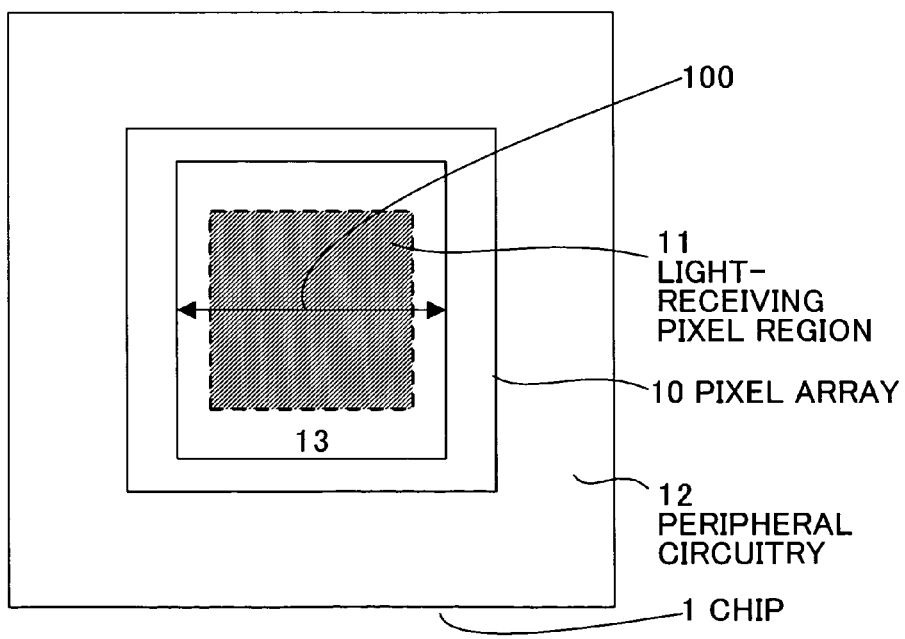

FIG. 5 is a diagram of an image sensor according to a second embodiment of the invention. As in FIG. 4, FIG. 5A is a cross-sectional view of an image sensor chip 1 housed in a package 2, and FIG. 5B is a plan view of the chip 1. The pixel array portion 10 and the peripheral circuitry portion 12 on the chip 1 are the same as in FIG. 4.

In this embodiment, the light-collecting convex lens 4 is large and exterior light is collected through this to the light-receiving pixel region 11. In addition, the size of the trench structure 100 has been made wider than the light-receiving pixel region 11 so as to keep the incident light from being blocked by the upper multilevel metallization layer 20. Here too, the upper multilevel metallization layer 20 is formed over both the peripheral circuitry portion 12 and part of the black pixel region 13, thus enabling the surface area of the power distribution plane formed on the multilevel metallization layer 20 to be increased.

Figure 6A:
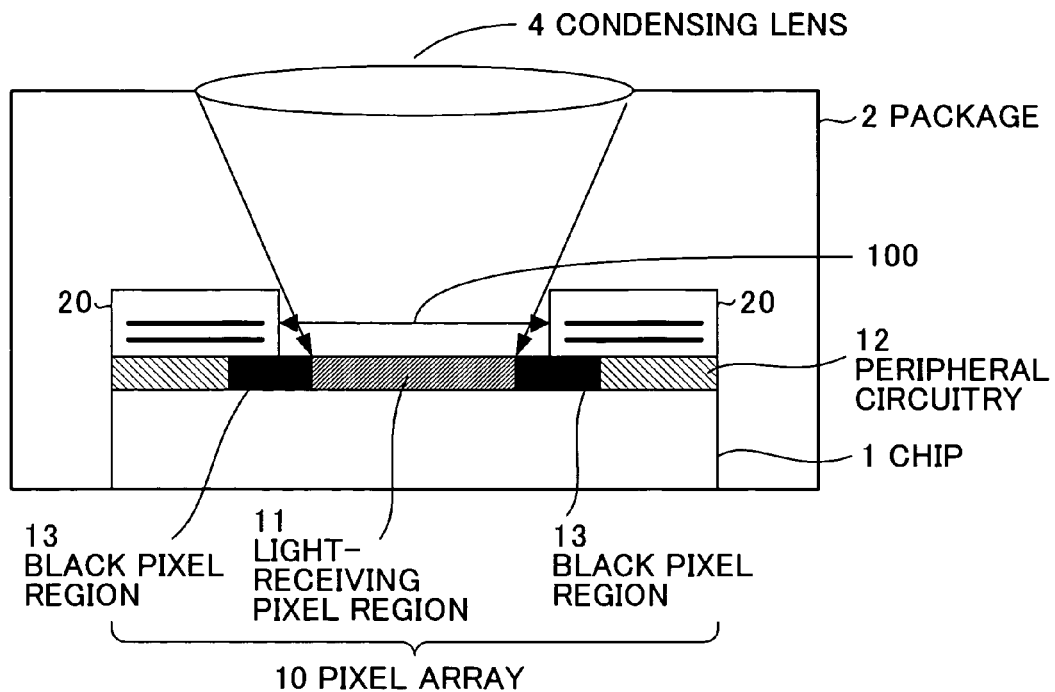
FIG. 6 is a diagram of an image sensor according to a third embodiment of the invention.
Figure 6B:
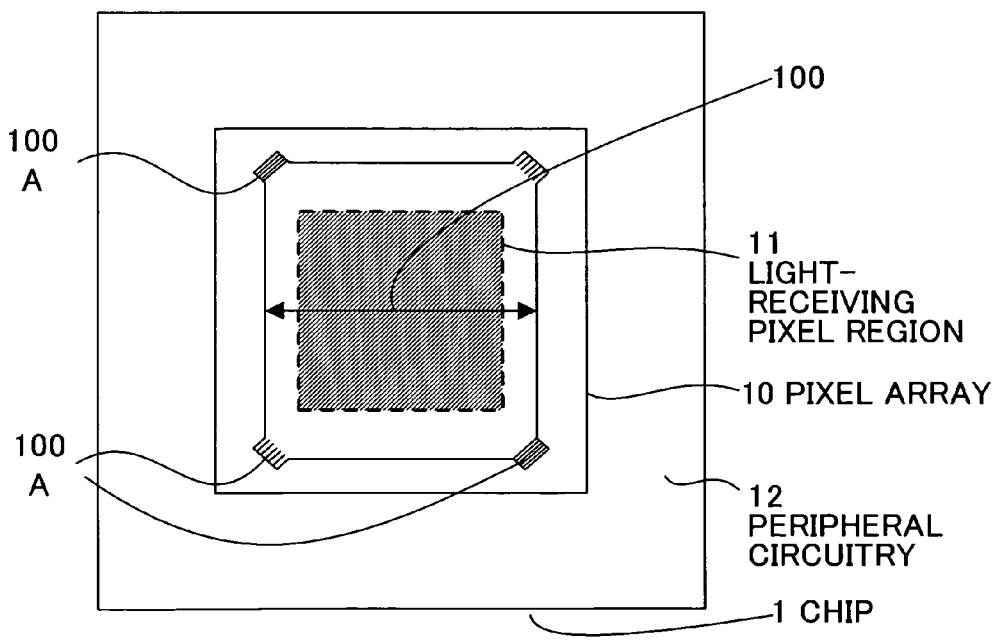

FIG. 6 is a diagram of an image sensor according to a third embodiment of the invention. As in FIG. 5, FIG. 6A is a cross-sectional view of an image sensor chip 1 housed in a package 2, and FIG. 6B is a plan view of the chip 1. FIG. 6A is similar to FIG. 5A.

In this embodiment, protrusions 100A are formed at the four corners of the trench structure 100 on the pixel array 10. In other respects, this embodiment is identical to the second embodiment described above. These protrusions 100A are provided so as to enable a layer of liquid material to form to a uniform film thickness at the bottom of the trench structure 100 when an optical color filter, microlens or photoreceptor resistor is produced by spin coating a layer of liquid material onto the trench structure 100.

Figure 7:
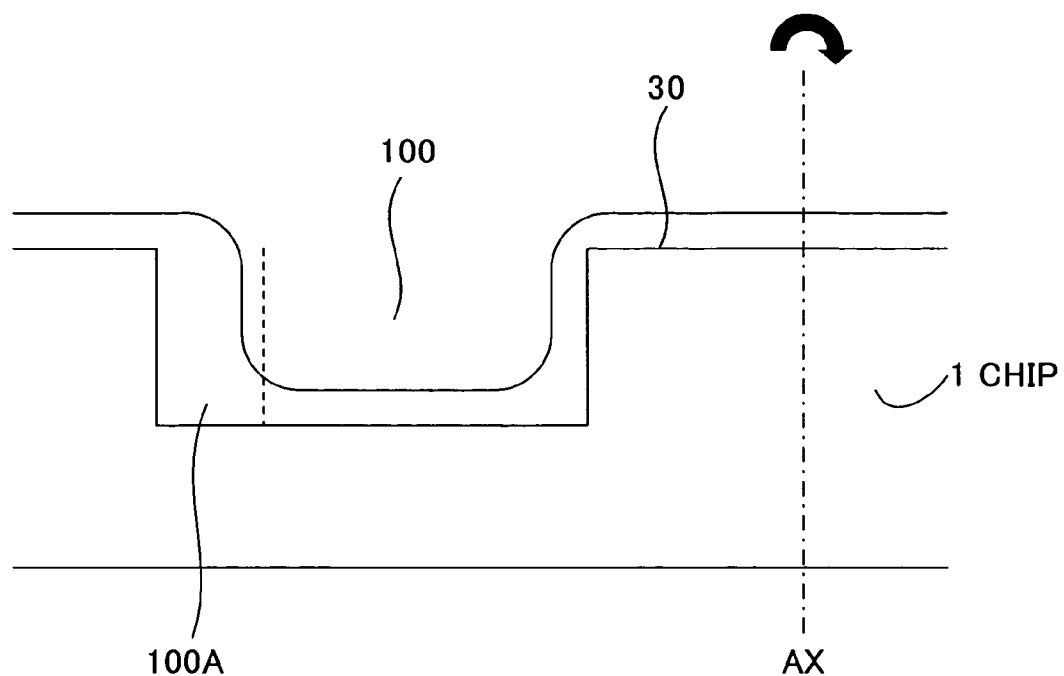
FIG. 7 illustrates the spin coating method used to form a layer of liquid material on a trench structure in the third embodiment of the invention.

FIG. 7 illustrates a spin coating method used to form a layer of liquid material on the trench structure in the third embodiment of the invention. In this spin coating method, the semiconductor wafer is mounted on a spinner and drops of the liquid material are made to fall onto the wafer while the wafer is being spun about an axis of rotation AX, thereby forming a uniform layer of liquid material on the wafer surface. In the present embodiment, a thin multilevel metallization layer is formed over the pixel array portion 10 of each chip, thereby creating a single trench structure 100 is formed. When a liquid material layer 30 is formed by spin coating on the bottom of the trench structure 100, much of the liquid material collects in one of the four corners of the trench structure 100 on account of the centrifugal force. As a result, there is a tendency for the liquid material layer 30 on the bottom of the trench structure 100 to have a non-uniform film thickness.

By providing protrusions 100A at the four corners of the trench structure 100, the layer of liquid material that collects due to the centrifugal force is absorbed at these protrusions 100A, enabling the film thickness of the liquid material layer 30 within the bottom to be made uniform. Because the position of the corner at which the liquid material collects under centrifugal force differs according to the position of the chip on the wafer, it is advantageous to provide protrusions 100A at all four corners of the trench structure 100.

FIGS. 8 to 11 illustrate the structure and method of fabrication for an image sensor according to a fourth embodiment of the invention. In each set of diagrams, (A) is a plan view of the image sensor chip, and (B) is a cross-section taken along A-B in the plan view. The cross-section at C-D in the plan view is identical.

Figure 8A:
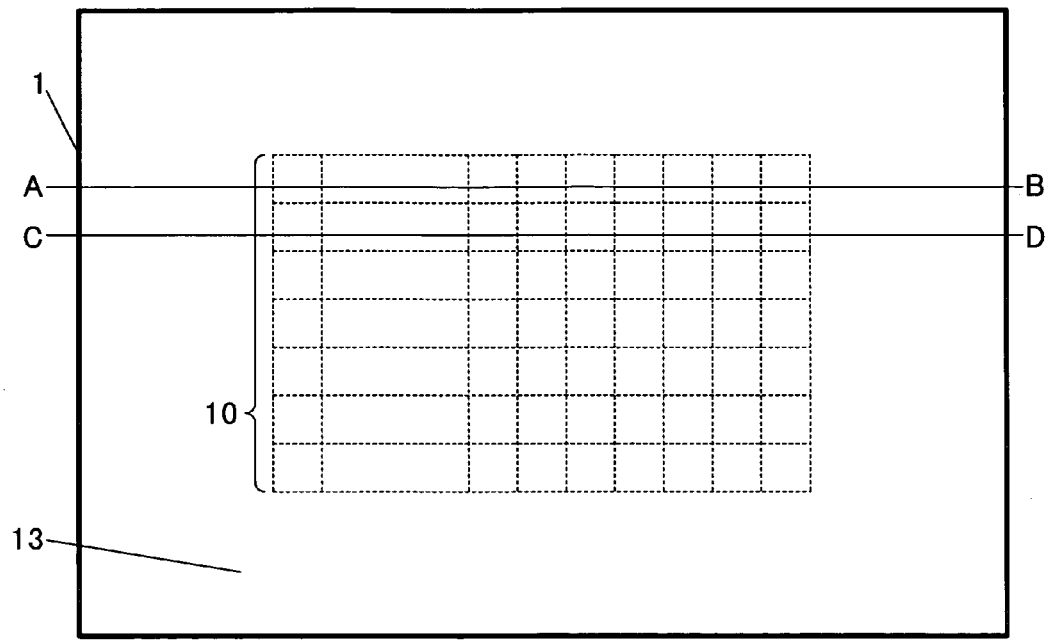
FIG. 8 illustrates the structure and method of fabrication for an image sensor according to a fourth embodiment of the invention.
Figure 8B:
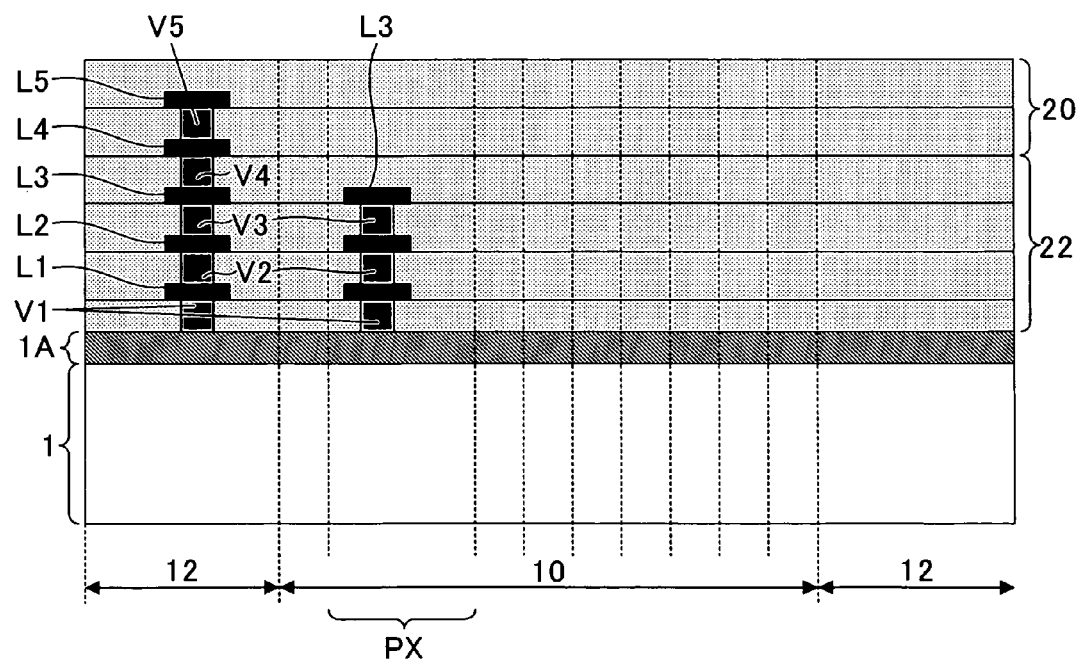

In FIG. 8, the pixel array portion 10 and the peripheral circuitry portion 12 are formed within a bulk layer 1A at the surface of the chip 1. In the plan view, pixel regions within the pixel array portion 10 are indicated by dotted lines. The pixels PX in the second column are shown wider than the other pixels in order to illustrate the multilevel metallization structure, but are in fact the same size as the other pixels.

Multilevel metallization layers 22 and 20 are formed on the bulk layer 1A. The multilevel metallization is composed of metal connection layers L1 to L5 which are made of an electrical conductive material such as metal, dielectric layers made of a silicon oxide (e.g., PSG or BPSG) film interposed between the levels of metallization, contact bias V1 with the bulk layer 1A, and electrically conductive bias V2 to V5 which provide connections between the metal connection layers. The multilevel metallization structure formed over the peripheral circuitry portion 12 includes a lower multilevel metallization structure 22 composed of three metal connection layers L1 to L3 and an upper multilevel metallization structure 20 composed of two metal connection layers L4 and L5. The multilevel metallization structure formed over the pixel array portion 10 includes the lower multilevel metallization structure 22 composed of three metal connection layers L1 to L3 and the upper multilevel metallization structure 20.

Figure 9:
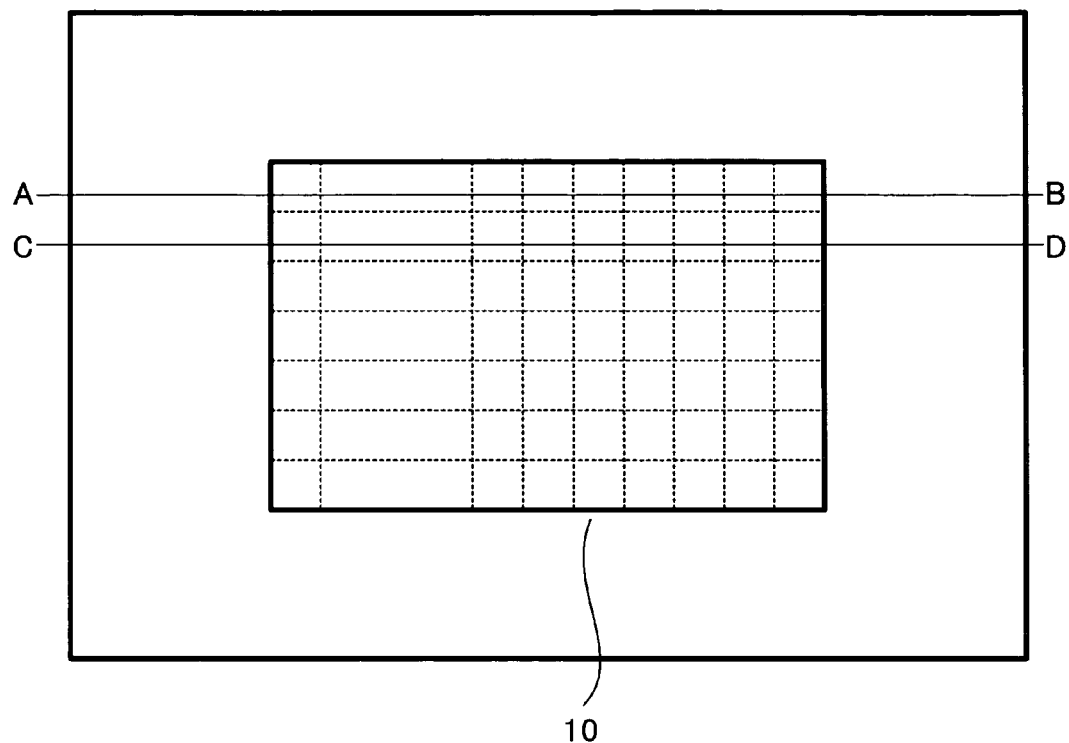
FIG. 9 also illustrates the structure and method of fabrication for an image sensor according to a fourth embodiment of the invention.
Figure 9:
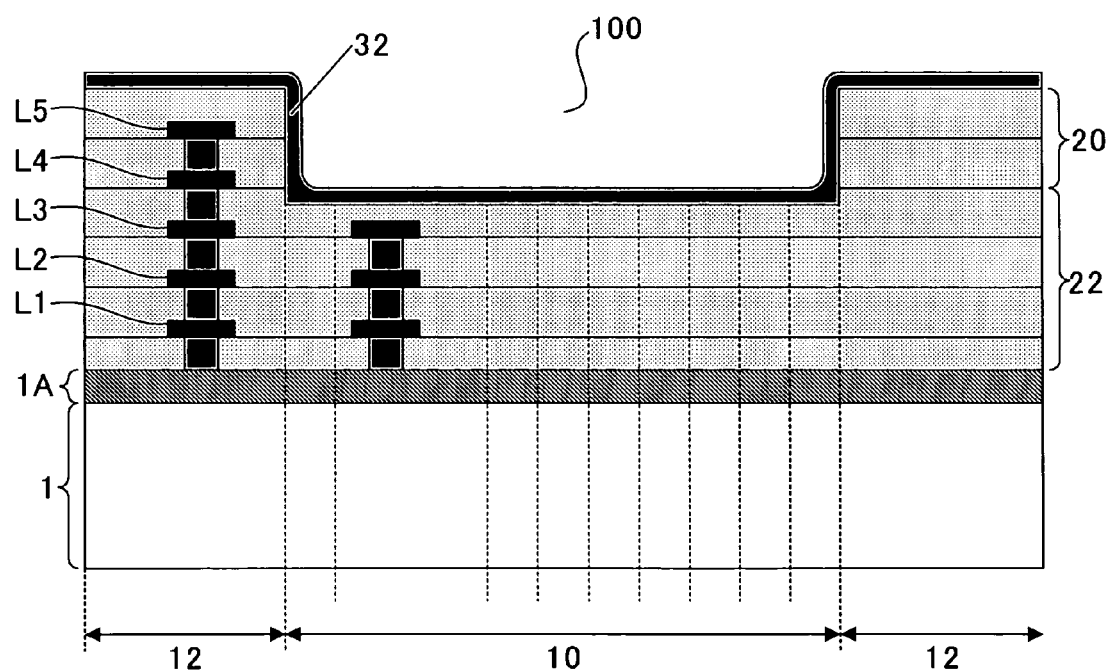

Referring to FIG. 9, the dielectric layers of the upper multilevel metallization structure 20 over the pixel array portion 10 are removed by a known etching process. In this etching process, the dielectric layers may be removed by, for example, a reactive ion etching process in which a photoresist layer is formed, exposed to light, and developed, after which the developed photoresist is used as a mask. Endpoint control of the etching is typically carried out by time control or with a specific etch stop layer. As shown in FIG. 9, the dielectric layer on the third metal connection layers L3 is partly removed by etching. This etching makes the multilevel metallization structure over the pixel array portion 10 thinner than the five-layer multilevel metallization structure over the peripheral circuit portion 12, forming a single trench structure 100. A protective film 32 such as a film of silicon nitride is then formed on the surface by chemical vapor deposition (CVD) or some other suitable process.

Figure 10:
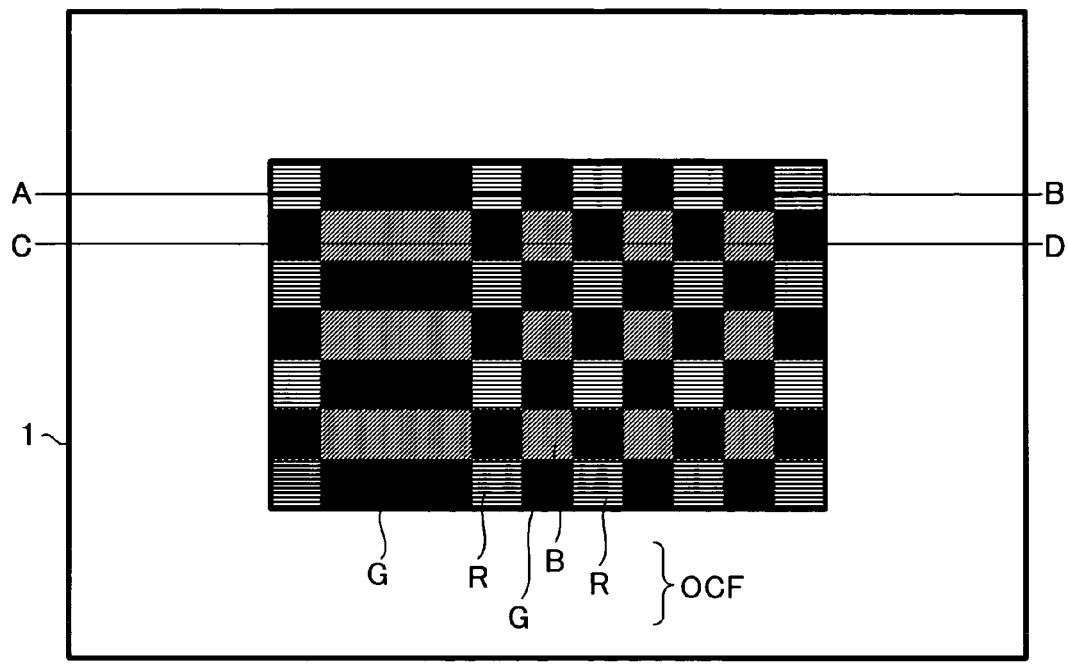
FIG. 10 additionally illustrates the structure and method of fabrication for an image sensor according to a fourth embodiment of the invention.
Figure 10:
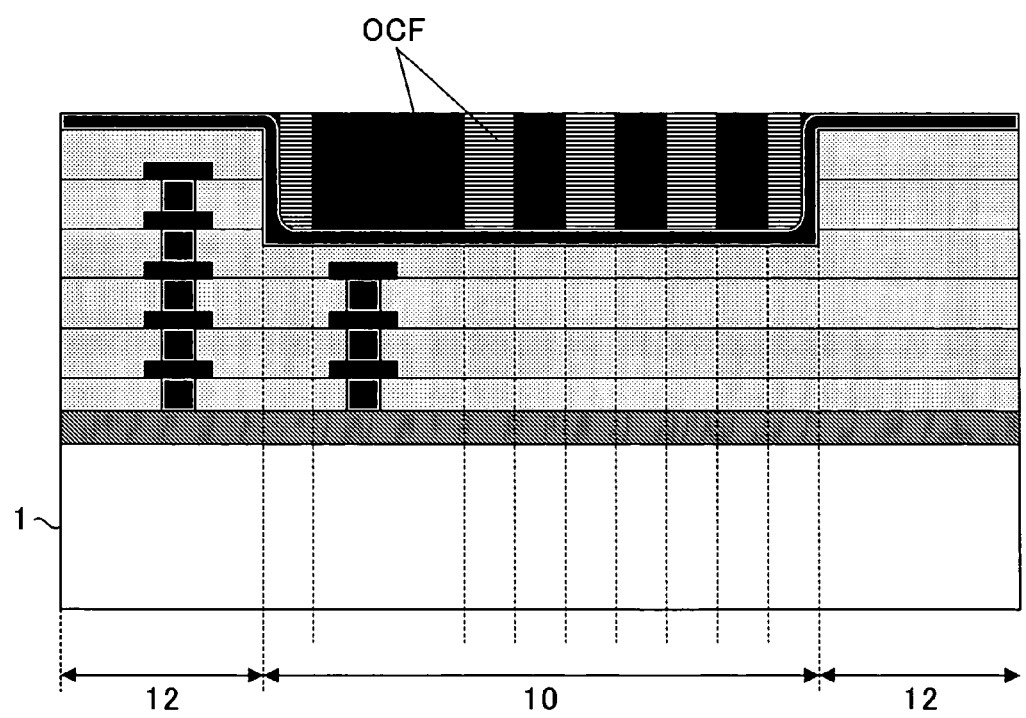

Next, referring to FIG. 10, optical color filters OCF are formed within the trench structure 100, and the surfaces are planarized. The optical color filters OCF, as shown in the plan view, consist of green G, blue B and red R filters in a Bayer array. To form the three types of optical color filters OCF, a process consisting of a spin coating step and a patterning step is repeated three times, once for each type of color filter. Finally, it is advantageous to planarize the surface of the filters by polishing or heat treatment.

Figure 11:
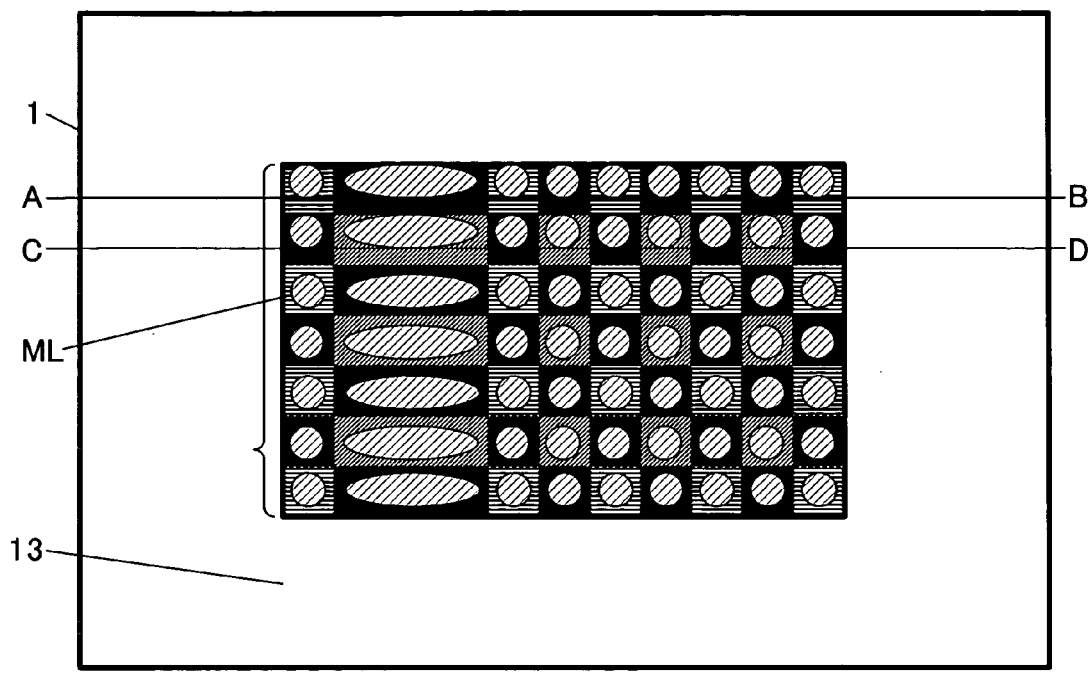
FIG. 11 further illustrates the structure and method of fabrication for an image sensor according to a fourth embodiment of the invention.
Figure 11:
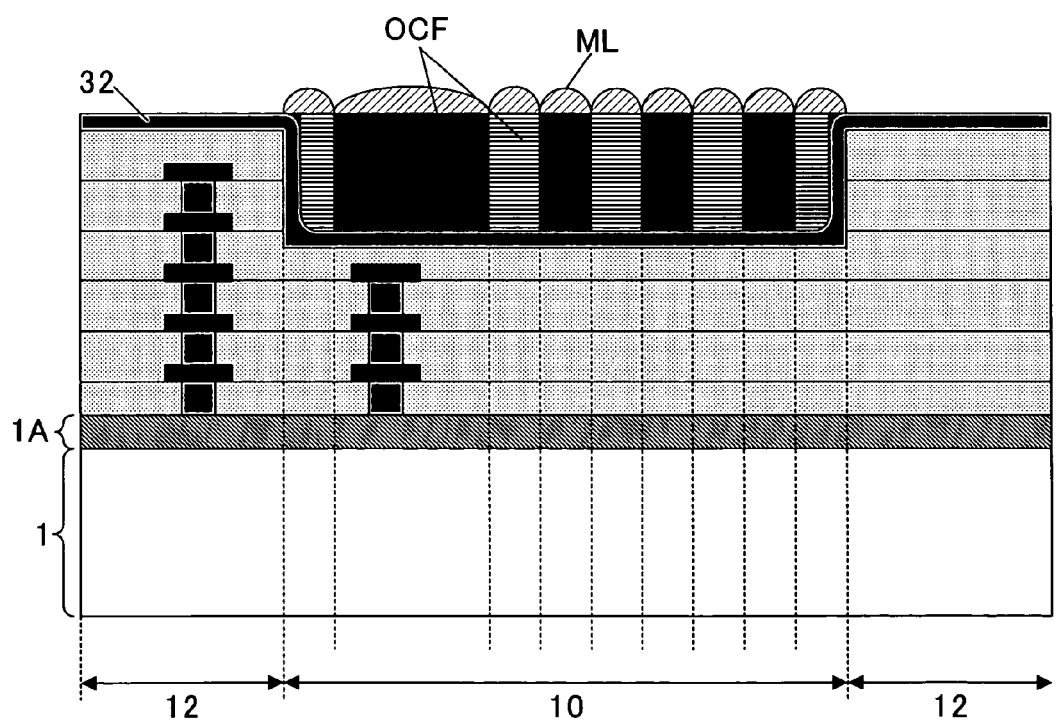

Next, referring to FIG. 11, microlenses ML are formed over the optical color filters OCF at each pixel position. The microlenses ML are formed by, for example, applying a clear organic material to the surface and patterning so as to leave an organic material layer at each pixel position, then heat treating so as to impart the cross-sectional shape of a convex lens. Because the optical color filter OCF has been buried within the trench structure 100 and planarized in the manner shown in FIG. 10, formation of the microlenses ML is relatively easy.

FIG. 11 is a plan view and a cross-sectional view showing the construction of the image sensor in the present embodiment. As shown in the diagrams, because only a thin multilevel metallization structure has been formed over the pixel array portion 10, the attenuation and scattering of incident light can be minimized here. Moreover, a five-layer multilevel metallization structure is formed over the peripheral circuitry portion 12, which provides a space-saving effect.

Figure 12:
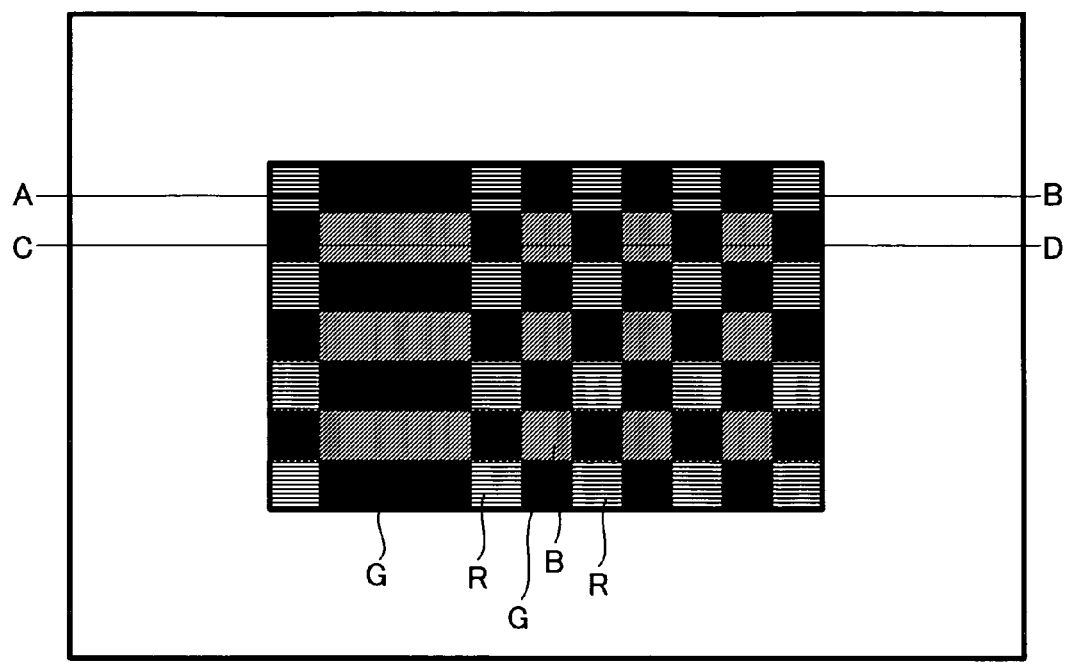
FIG. 12 illustrates the structure and method of fabrication for an image sensor according to a fifth embodiment of the invention.
Figure 12:
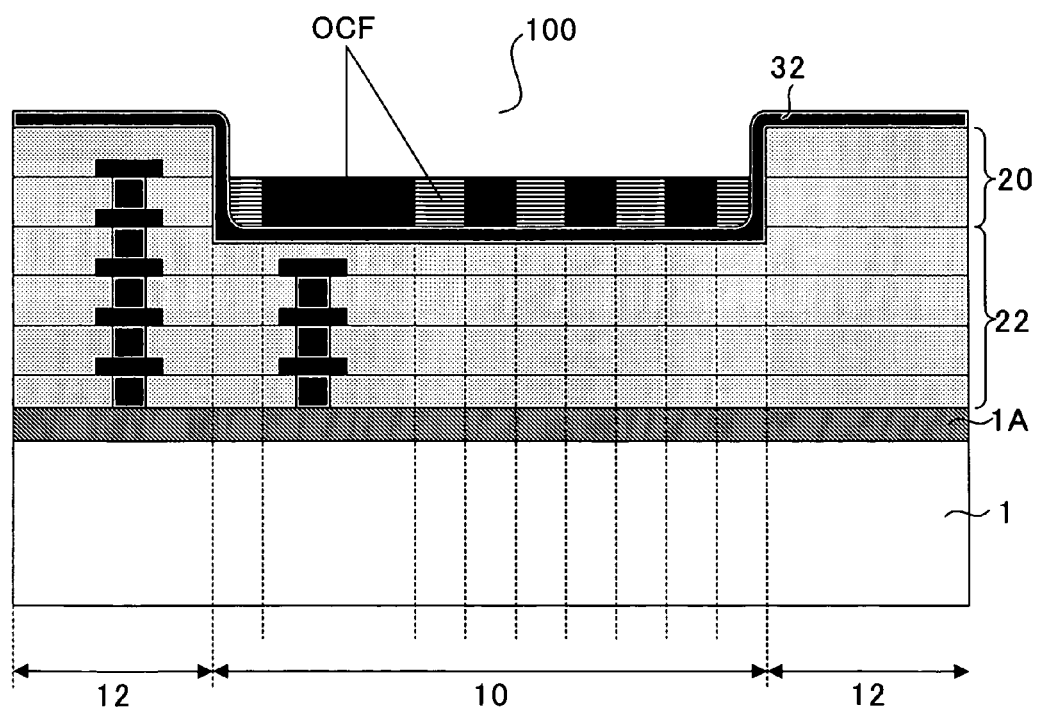
Figure 13:
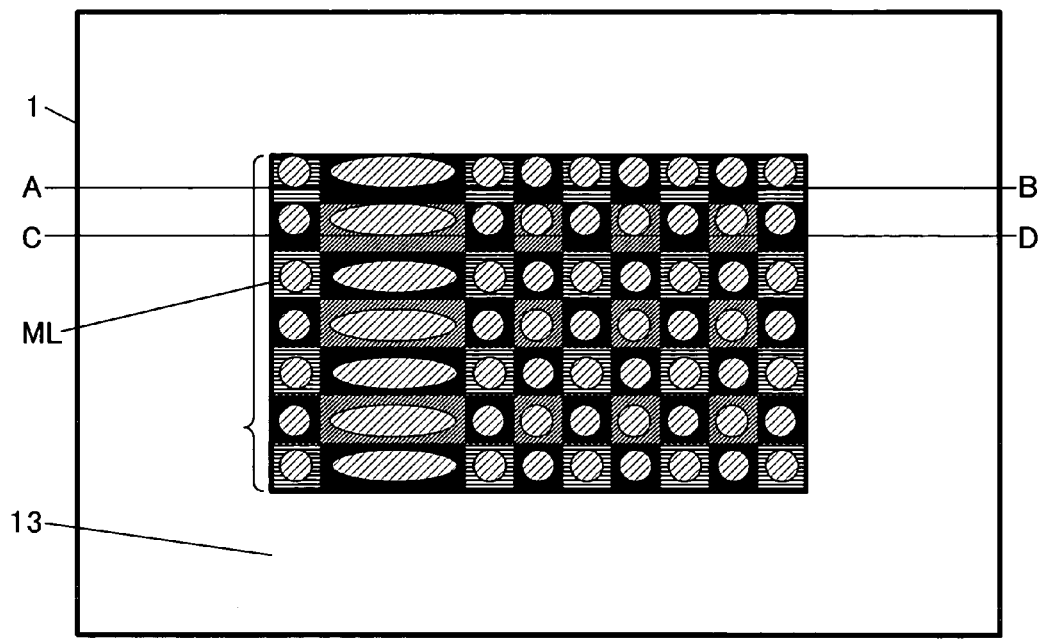
FIG. 13 also illustrates the structure and method of fabrication for an image sensor according to a fifth embodiment of the invention.
Figure 13:
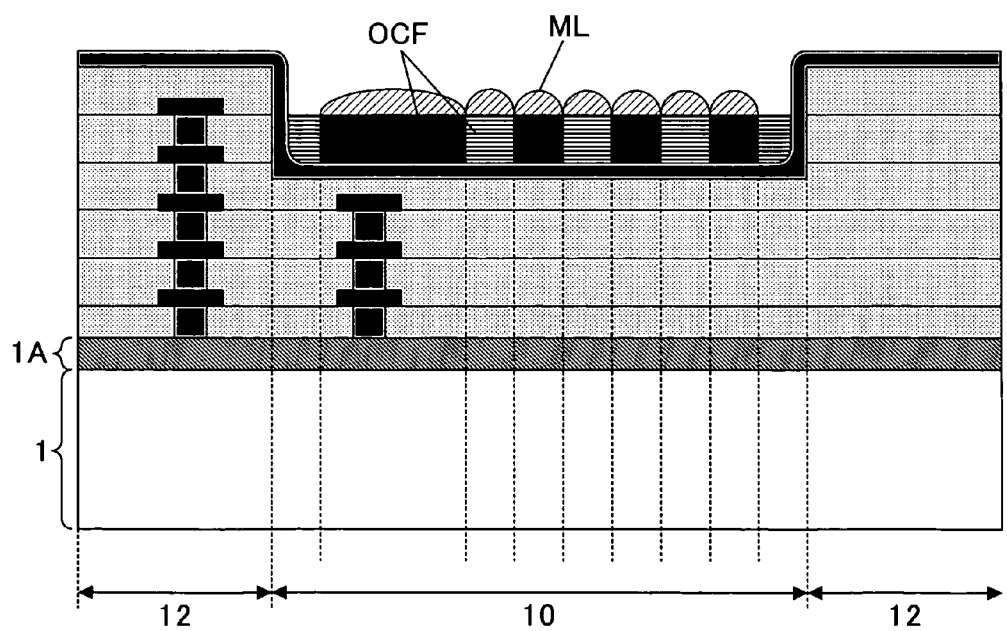

FIGS. 12 and 13 illustrate the structure and method of fabrication for an image sensor according to a fifth embodiment of the invention. In this embodiment as well, a multilevel metallization structure 20 and 22 having five layers is formed over the peripheral circuitry portion 12, and a multilevel metallization structure 22 having three layers is formed over the pixel array portion 10. The fourth and fifth interlayer dielectric layers over the pixel array portion 10 are then removed, forming a trench structure 100, after which a protective layer 32 is formed. Hence, the same process as in FIGS. 8 and 9 is carried out in this fifth embodiment as well.

Next, referring to FIG. 12, optical color filters OCF are formed over the trench structure 100. These optical color filters have a thickness which is smaller than the depth of the trench structure 100, and so the top surface of the optical color filters OCF is lower than the top surface of the multilevel metallization structure 20. The optical color filters are fabricated by the same method as in the fourth embodiment.

Next, referring to FIG. 13, microlenses ML are formed over the optical color filters OCF at each pixel region. The method of fabricating the microlenses ML is the same as in the fourth embodiment. The plan view and cross-sectional view in FIG. 13 show the construction of the image sensors. In the present embodiment, the optical color filters OCF formed within the trench structure 100 have a small thickness. As a result, the distance from the microlenses ML to the bulk layer 1A of the pixel array portion 10 can be shortened, enabling attenuation of the incident light to be minimized.

In addition, the organic material is heat-treated so as to impart to the microlenses ML the shape of a convex lens. However, because it is not easy to increase the focal distance of such a heat-treated convex lens, the microlenses ML tend to have a short focal distance. In the present embodiment, the thickness of the optical color filters OCF has been reduced, enabling the pixel array portion 10 to be disposed at a position that corresponds to such short focal length microlenses ML and thereby increasing the light-collecting efficiency.

As demonstrated above, these embodiments make it possible provide the chip in an image sensor with a higher degree of integration and a smaller size, and at the same time minimize the scattering and attenuation of incident light to the pixel array.

What is claimed is:

1. A solid-state imaging device comprising:
   a substrate in which are formed a pixel array portion having a plurality of pixels each of which includes a photoelectric converter and a transistor, and a peripheral circuitry portion peripheral to the pixel array portion;
   a first multilevel metallization structure including first multilevel connection layers, first multilevel dielectric layers therebetween, and first multilevel conductive vias formed in the first multilevel dielectric layers for connecting the first multilevel connection layers to each other, and formed over the peripheral circuitry portion; and
   a second multilevel metallization structure including second multilevel connection layers, second multilevel dielectric layers therebetween, and second multilevel conductive vias formed in the second multilevel dielectric layers for connecting the second multilevel connection layers to each other, being thinner than the first multilevel metallization structure, and formed over the pixel array portion.

2. The solid-state imaging device according to claim 1, wherein
   a single trench structure is formed over the pixel array portion, the single trench structure being formed by the first multilevel metallization structure formed over the peripheral circuitry portion and the second multilevel metallization structure formed over the pixel array portion, and the trench structure has a protrusion in at least one corner thereof, and
   the device further comprising a color filter film formed on a bottom of the trench structure by spin coating and a microlens over each pixel.

3. The solid-state imaging device according to claim 1, wherein
   a single trench structure is formed over the pixel array portion, the single trench structure being formed by the first multilevel metallization structure formed over the peripheral circuitry portion and the second multilevel metallization structure formed over the pixel array portion, the trench structure extends over a region that includes at least part of the pixel array portion.

4. The solid-state imaging device according to claim 3, wherein the trench structure region coincides with a central light-receiving pixel region of the pixel array portion that excludes peripheral black pixels.

5. The solid-state imaging device according to claim 3, wherein
the trench structure region is wider than a central light-receiving pixel region of the pixel array portion that excludes peripheral black pixels.

6. The solid-state imaging device according to claim 1, wherein
a single trench structure is formed over the pixel array portion, the single trench structure being formed by the first multilevel metallization structure formed over the peripheral circuitry portion and the second multilevel metallization structure formed over the pixel array portion, an optical color filter film is formed within the trench structure, a microlens for each pixel is formed over the optical color filter film, and the optical color filter film has a thickness which is substantially equal to the depth of the trench structure.

7. The solid-state imaging device according to claim 1, wherein
a single trench structure is formed over the pixel array portion, the single trench structure being formed by the first multilevel metallization structure formed over the peripheral circuitry portion and the second multilevel metallization structure formed over the pixel array portion, an optical color filter film is formed within the trench structure, a microlens for each pixel is formed over the optical color filter film, and the optical color filter film has a thickness which is smaller than the depth of the trench structure.

8. A solid-state imaging device comprising:
a substrate in which are formed a pixel array portion having a plurality of pixels each of which includes a photo-electric converter and a transistor, and a periphery circuitry portion peripheral to the pixel array portion;
a first multilevel metallization structure which is formed over the peripheral circuitry portion and has a plurality of first connection layers, a plurality of first dielectric layers therebetween and a plurality of first vias for connecting the first connection layers to each other; and
a second multilevel metallization structure which is formed over the pixel array portion and has a smaller number of second connection layers than the first multilevel metallization structure, a plurality of second connection layers therebetween and a plurality of second vias for connecting the second connection layers to each other.

9. A solid-state imaging device comprising:
a substrate in which are formed a pixel array portion having a plurality of pixels each of which includes a photo-electric converter and a transistor, and a periphery circuitry portion peripheral to the pixel array portion;
a first multilevel metallization structure which is formed over the peripheral circuitry portion and has a plurality of first connection layers, a plurality of first dielectric layers therebetween and a plurality of first vias for connecting the first connection layers to each other; and
a second multilevel metallization structure which is formed over the pixel array portion and has a smaller number of second connection layers than the first multilevel metallization structure, a plurality of second dielectric layers therebetween and a plurality of second vias for connecting the second connection layers to each other, over which a color filter film is formed at a level corresponding to the uppermost level of the first multilevel metallization structure.

10. The solid-state imaging device according to claim 4, wherein the pixel array portion includes the central light-receiving pixel region and the peripheral black pixels located outside of the central light-receiving pixel region.

11. The solid-state imaging device according to claim 5, wherein the pixel array portion includes the central light-receiving pixel region and the peripheral black pixels located outside of the central light-receiving pixel region.

12. The solid-state imaging device according to claim 1, wherein the number of the second multilevel connection layers is lower than the number of the first multilevel connection layers.

13. The solid-state imaging device according to claim 1, wherein said transistor in each of the pixel includes a transfer transistor connected to the photo-electric converter.

14. The solid-state imaging device according to claim 8, wherein said transistor in each of the pixel includes a transfer transistor connected to the photo-electric converter.

15. The solid-state imaging device according to claim 9, wherein said transistor in each of the pixel includes a transfer transistor connected to the photo-electric converter.

16. The solid-state imaging device according to claim 1, wherein said peripheral circuit portion includes an analog circuit.

17. The solid-state imaging device according to claim 8, wherein said peripheral circuit portion includes an analog circuit.

18. The solid-state imaging device according to claim 9, wherein said peripheral circuit portion includes an analog circuit.

19. A solid-state imaging device comprising:
a substrate in which are formed a pixel array portion having a plurality of pixels each of which includes a photo-electric converter and a transistor, and a peripheral circuitry portion peripheral to the pixel array portion;
a first multilevel connection layers structure including first connection layers, first dielectric layers therebetween and first vias for connecting the first connection layers to each other, and formed over the peripheral circuitry portion; and
a second multilevel connecting layers structure including second connection layers, second dielectric layers therebetween and second vias for connecting the second connection layers to each other, and formed over the pixel array portion,
wherein the thickness of the first dielectric layers of the first multilevel connection layers structure is thinner than the thickness of the second dielectric layers of the second multilevel connection layers structure.

* * * * *